United States Patent
Hill

(10) Patent No.: US 7,544,579 B1
(45) Date of Patent: Jun. 9, 2009

(54) SYSTEM AND METHOD FOR FACETING THE CORNERS OF A RESISTOR PROTECT LAYER TO REDUCE VERTICAL STEP HEIGHT

(75) Inventor: Rodney Hill, Mansfield, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 266 days.

(21) Appl. No.: 11/080,177

(22) Filed: Mar. 15, 2005

(51) Int. Cl.
*H01L 21/20* (2006.01)

(52) U.S. Cl. .................. 438/382; 438/384; 438/238; 257/E21.004

(58) Field of Classification Search ............... 438/382, 438/384, 210, 238, 381
See application file for complete search history.

(56) References Cited

U.S. PATENT DOCUMENTS

| | | | | |
|---|---|---|---|---|
| 5,203,957 A | * | 4/1993 | Yoo et al. | 438/640 |
| 5,346,585 A | * | 9/1994 | Doan et al. | 438/690 |
| 5,384,278 A | * | 1/1995 | Singlevich | 438/384 |
| 6,004,882 A | | 12/1999 | Kim et al. | |
| 6,165,862 A | * | 12/2000 | Ishikawa et al. | 438/384 |
| 2004/0012071 A1 | * | 1/2004 | Ido et al. | 257/529 |
| 2007/0037386 A1 | | 2/2007 | Williams | |

OTHER PUBLICATIONS

U.S. Appl. No. 11/285,702, filed Nov. 21, 2005, "System and Method for Faceting a Masking Layer in a Plasma Etch to Slope a Feature Edge".

* cited by examiner

*Primary Examiner*—Michael Trinh

(57) ABSTRACT

A system and method is disclosed for providing a resistor protect layer to protect a thin film resistor in a semiconductor device. A thin film resistor is formed on a dielectric layer and a resistor protect layer is placed over the thin film resistor. An etch procedure is employed to facet the corners of the resistor protect layer. The faceted corners of the resistor protect layer reduce the step height of the resistor protect layer. Then a conductor is deposited over the resistor protect layer and the dielectric layer. When portions of the conductor are subsequently etched away, the resistor protect layer protects the underlying thin film resistor from being exposed to the etch process.

17 Claims, 4 Drawing Sheets

SYSTEM AND METHOD FOR FACETING THE CORNERS OF A RESISTOR PROTECT LAYER TO REDUCE VERTICAL STEP HEIGHT

TECHNICAL FIELD OF THE INVENTION

The present invention is generally directed to the manufacture of semiconductor circuits and, in particular, to a system and method for faceting the corners of resistor protect lines in a semiconductor circuit to reduce vertical step height.

BACKGROUND OF THE INVENTION

When semiconductor devices are manufactured it is a common practice to place thin film resistors on a dielectric layer and cover them with a resistor protect layer. At a later time the resistor protect layer may be covered with a conductor layer. When portions of the conductor layer are subsequently etched away the etch process may also etch away some portions of the resistor protect layer.

In the prior art when an etch process is applied to completely etch away the last remaining filament portions of the conductor layer the etch process may also etch away additional portions of the resistor protect layer and expose the underlying thin film resistor. This means that the underlying thin film resistor will be susceptible to plasma damage from the etch process. That is, if an etch process is used to completely remove the last remaining conductive filament portions of a conductor layer the etch process may detrimentally etch and damage any exposed portions of the thin film resistor.

Therefore, there is a need in the art for a system and method that is capable of providing protection for thin film resistors that are located under a resistor protect layer so that the thin film resistors are not exposed to an etch process. There is also a need in the art for a system and method that is capable of providing an improved resistor protect layer that is capable of completely shielding an underlying thin film resistor from an etch process.

SUMMARY OF THE INVENTION

To address the above-discussed deficiencies of the prior art, it is a primary object of the present invention to provide a system and method for faceting the corners of a resistor protect layer to reduce a step height of the resistor protect layer in order to protect a thin film resistor in a semiconductor device.

In one advantageous embodiment of the present invention, an improved resistor protect layer is provided to protect a thin film resistor in a semiconductor device. A thin film resistor is formed on a dielectric layer and a resistor protect layer is placed over the thin film resistor. An etch procedure is employed to facet the corners of the resistor protect layer. The faceted corners of the resistor protect layer reduce the step height of the resistor protect layer. Then a conductor is deposited over the resistor protect layer and the dielectric layer. When portions of the conductor are subsequently etched away, the resistor protect layer protects the underlying thin film resistor from being exposed to the etch process.

It is an object of the present invention to provide a system and method for faceting the corners of a resistor protect layer in a semiconductor device.

It is also an object of the present invention to provide a system and method for faceting the corners of a resistor protect layer in a semiconductor device in order to reduce the step height of the resistor protect layer.

It is yet another object of the present invention to provide a system and method for faceting the corners of a resistor protect layer to reduce a step height of the resistor protect layer in order to protect a thin film resistor in a semiconductor device from an etch process.

It is another object of the present invention to provide an improved resistor protect layer that is capable of protecting an underlying thin film resistor from plasma damage due to an exposure to an etch process.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 1 illustrates a cross sectional view of a prior art integrated circuit device showing a thin film resistor mounted on a dielectric layer and a resistor protect layer covering the thin film resistor and a conductor covering the resistor protect layer;

FIG. 2 illustrates a cross sectional view of the prior art integrated circuit device shown in FIG. 1 in which an etch process has been applied to etch away portions of the conductor exposing portions of the dielectric layer and portions of the resistor protect layer;

FIG. 3 illustrates a cross sectional view of the prior art integrated circuit device shown in FIG. 2 in which an etch process has been applied to etch away additional portions of the conductor and portions of the resistor protect layer;

FIG. 4 illustrates a cross sectional view of the prior art integrated circuit device shown in FIG. 3 in which an etch process has been applied to etch away additional portions of the conductor and additional portions of the resistor protect layer to expose the thin film resistor;

FIG. 5 illustrates a cross sectional view of an integrated circuit device of the present invention showing a thin film resistor mounted on a dielectric layer and a resistor protect layer covering the thin film resistor;

FIG. 6 illustrates a cross sectional view of the integrated circuit device shown in FIG. 5 to which an etch process has been applied to facet the corners of the resistor protect layer;

FIG. 7 illustrates a cross sectional view of the integrated circuit device shown in FIG. 6 in which a conductor has been applied to cover the resistor protect layer and the dielectric layer;

FIG. 8 illustrates a cross sectional view of the integrated circuit device shown in FIG. 7 in which an etch process has been applied to etch away portions of the conductor to expose the dielectric layer and the top surface of the resistor protect layer;

FIG. 9 illustrates a cross sectional view of the integrated circuit device shown in FIG. 8 in which an etch process has been applied to etch away the remaining portions of the conductor and a portion of the resistor protect layer.

DETAILED DESCRIPTION OF THE INVENTION

Figure 1:
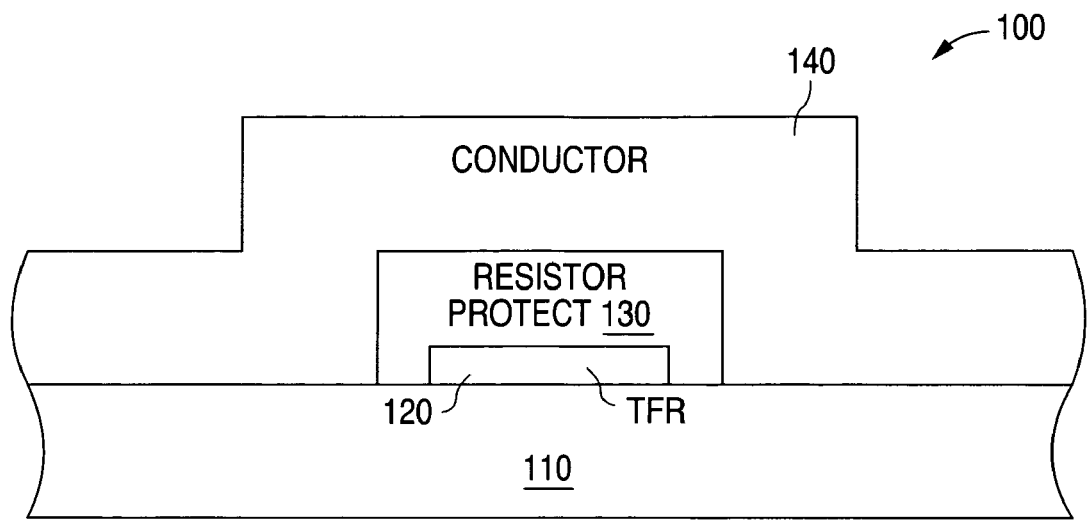
FIGS. 1 through 4 illustrate successive stages in the etching of a resistor protect layer over a thin film resistor in an integrated circuit device in accordance with a prior art method.

FIGS. 1 through 10 and the various embodiments used to describe the principles of the present invention in this patent document are by way of illustration only and should not be construed in any way to limit the scope of the invention. Those skilled in the art will understand that the principles of the present invention may be implemented in any type of suitably arranged integrated circuit device.

To simplify the drawings the reference numerals from previous drawings will sometimes not be repeated for structures that have already been identified.

In order to better understand the principles of the present invention a description of the construction of an exemplary prior art thin film resistor (TFR) in an integrated circuit device will first be given. FIGS. 1 through 4 illustrate successive stages in the etching of a resistor protect layer over a thin film resistor in an integrated circuit device in accordance with a prior art method.

The exemplary prior art integrated circuit device shown in FIG. 1 comprises a dielectric layer 110. A thin film resistor (TFR) 120 is placed over dielectric layer 110. The thin film resistor (TFR) 120 is covered with a resistor protect layer 130. Resistor protect layer 130 may comprise a metal such as titanium tungsten (TiW). Resistor protect layer 130 and dielectric layer 110 are completely covered with a conductor 140. The stage of the integrated circuit device shown in FIG. 1 is designated with reference numeral 100.

Figure 2:
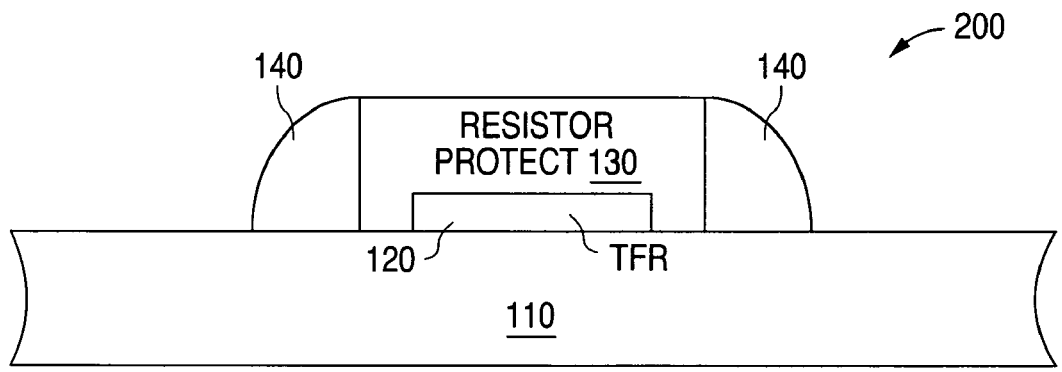

In the next step of the exemplary prior art method an etch process is applied to the integrated circuit device shown in FIG. 1. The result of applying the etch process is shown in FIG. 2. The etch process etches away portions of the conductor 140 and exposes portions of the dielectric layer 100 and the top surface of resistor protect layer 130. As shown in FIG. 2, portions of conductor 140 remain on the vertical sides of the resistor protect layer 130. The stage of the integrated circuit device shown in FIG. 2 is designated with reference numeral 200.

Figure 3:
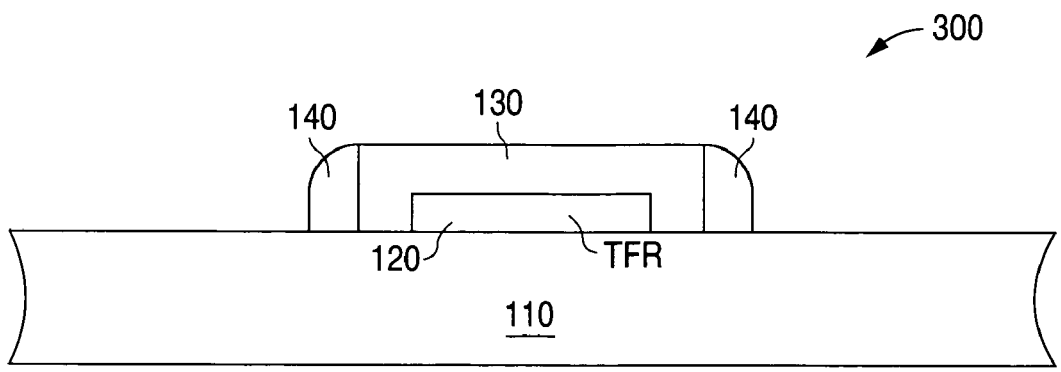

In the next step of the exemplary prior art method the etch process continues and the etch process is applied to the integrated circuit device shown in FIG. 2. The result of applying the etch process is shown in FIG. 3. The etch process etches away additional portions of the conductor 140 and portions of the top of resistor protect layer 130. As shown in FIG. 3, smaller portions of conductor 140 continue to remain on the vertical sides of the resistor protect layer 130. The stage of the integrated circuit device shown in FIG. 3 is designated with reference numeral 300.

Figure 4:
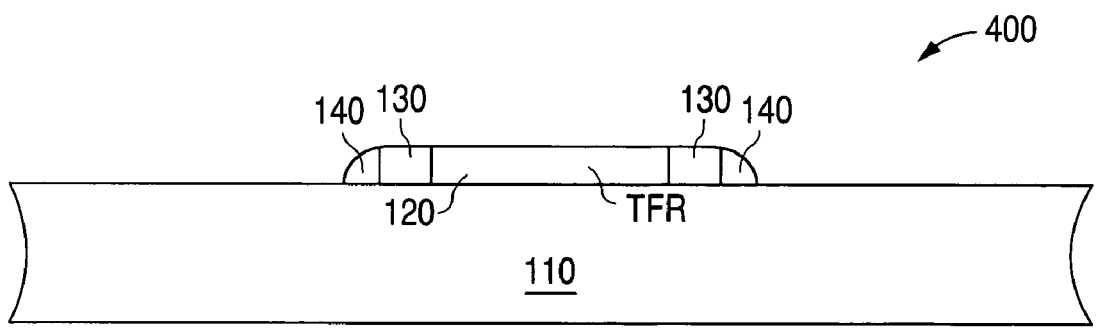

In the next step of the exemplary prior art method the etch process continues and the etch process is applied to the integrated circuit device shown in FIG. 3. The result of applying the etch process is shown in FIG. 4. The etch process etches away additional portions of the conductor 140 and additional portions of the resistor protect layer 130 to expose the top surface of the thin film resistor (TFR) 120. As shown in FIG. 4, smaller portions of conductor 140 continue to remain on the vertical sides of the resistor protect layer 130. The stage of the integrated circuit device shown in FIG. 4 is designated with reference numeral 400.

The remaining small portions of conductor 140 are conductive filaments that must be removed. If an etch process is used to completely remove the conductive filaments of conductor 140 in integrated circuit device 400 the etch process would detrimentally etch the exposed portions of the thin film resistor (TFR) 120. This would damage the thin film resistor (TFR) 120.

As will be more fully described, the system and method of the present invention solves this problem by faceting the corners of the resistor protect layer. A description of the construction of an exemplary resistor protect layer in an integrated circuit device in accordance with the principles of the present invention will now be given. FIGS. 5 through 9 illustrate successive stages in the construction of a resistor protect layer in an integrated circuit device in accordance with the principles of the present invention.

Figure 5:
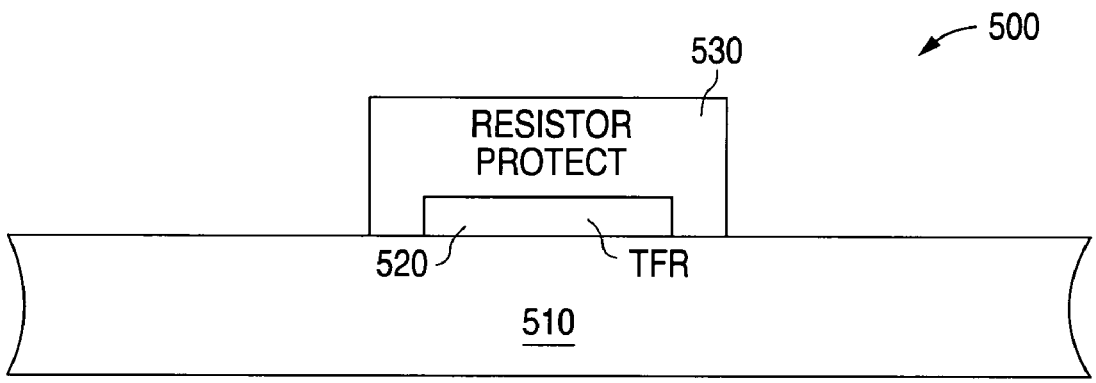
FIGS. 5 through 9 illustrate successive stages in the etching of a resistor protect layer over a thin film resistor in an integrated circuit device in accordance with the principles of the present invention.

The exemplary integrated circuit device 500 shown in FIG. 5 comprises a dielectric layer 510. A thin film resistor (TFR) 520 is placed over dielectric layer 510. The thin film resistor (TFR) 520 is covered with a resistor protect layer 530. Resistor protect layer 530 may comprise a metal such as titanium tungsten (TiW). As shown in FIG. 5 the resistor protect layer 530 has vertical walls.

Figure 6:
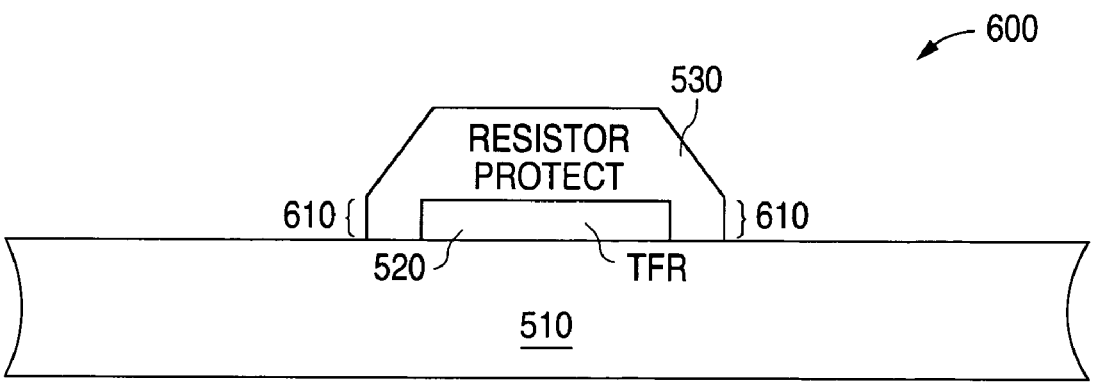

In the next step of the exemplary method of the invention an etch process is applied to the integrated circuit device 500 shown in FIG. 5. The result of applying the etch process is shown in FIG. 6. The stage of the integrated circuit device shown in FIG. 6 is designated with reference numeral 600.

The etch process etches away the corner portions of the resistor protect layer 530 to facet the corners of the resistor protect layer 530. The removal of the corner portions reduces the vertical step height of the resistor protect layer 530. As shown in FIG. 6 the height 610 of the vertical walls of resistor protect layer 530 has been significantly reduced. In the example shown in FIG. 6 the height 610 is approximately one fourth of the original height of the vertical walls of resistor protect layer 530. It is understood that the invention is not limited to this exemplary value of height. Other values of height may also be used that are greater or smaller than one fourth of the original vertical wall height of resistor protect layer 530.

In an advantageous embodiment of the invention, the etch process that is used to etch the corners of resistor protect layer 530 has a high sputter yield between approximately forty five degrees (45°) and approximately sixty degrees (60°). A plasma etch with a high sputter etch component is required. Such plasmas can be formed by using inert gases such as argon (Ar). Alternatively, such plasmas can be formed by using a combination of inert gases and reactive gases such as argon (Ar) and carbon tetrafluoride ($CF_4$) with gas flow ratios that are conducive to sputter etching. Those skilled in the art understand that other types of etch processes may be used.

Figure 7:
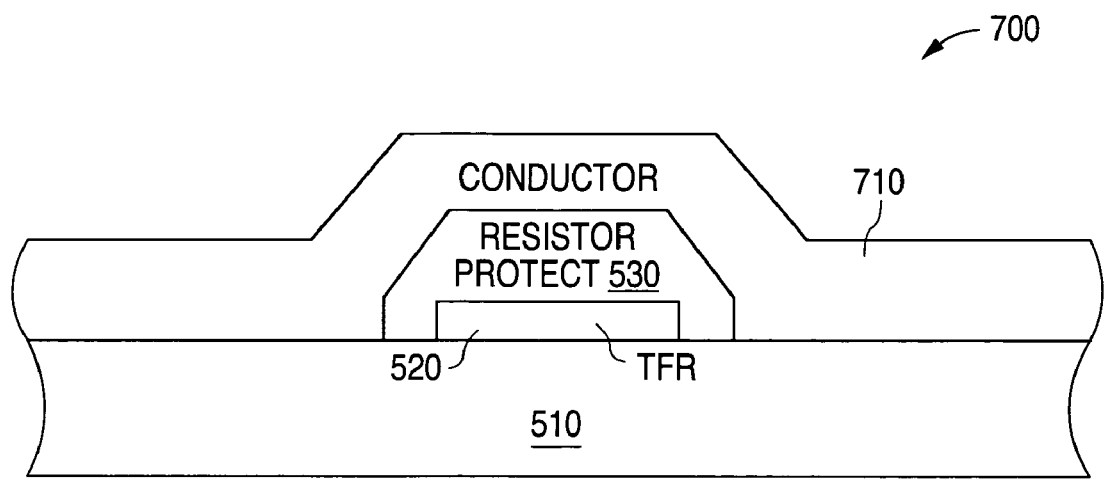

In the next step of the exemplary method of the invention a conductor 710 is applied to the surfaces of the integrated circuit device 600 shown in FIG. 6. The result of applying the conductor 710 is shown in FIG. 7. The stage of the integrated circuit device shown in FIG. 7 is designated with reference numeral 700. The conductor 710 covers the resistor protect layer 530 and the dielectric layer 510.

Figure 8:
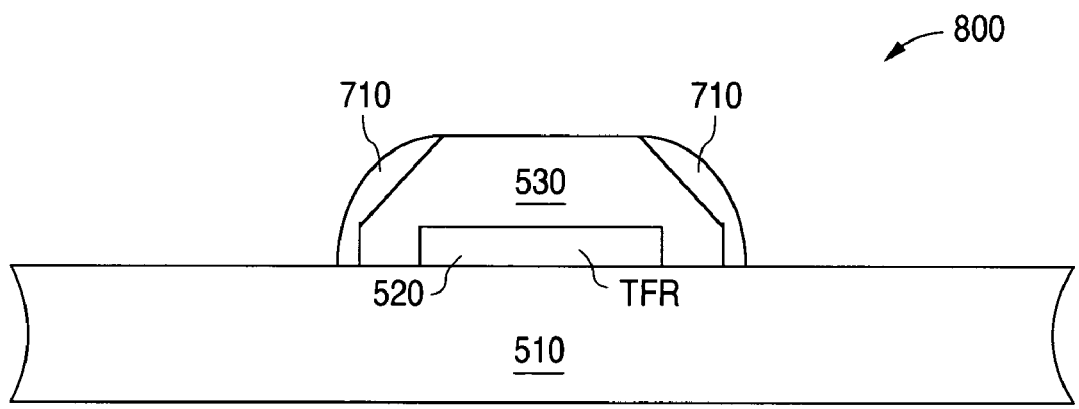

In the next step of the exemplary method of the invention portions of the conductor 710 are etched away to expose the dielectric layer 510 and the top surface of the resistor protect layer 530. The result of etching the conductor 710 is shown in FIG. 8. The stage of the integrated circuit device shown in FIG. 8 is designated with reference numeral 800. As shown in FIG. 8, smaller portions of conductor 710 remain on the faceted edges of the resistor protect layer 530. The remaining small portions of conductor 710 are conductive filaments that must be removed.

Figure 9:
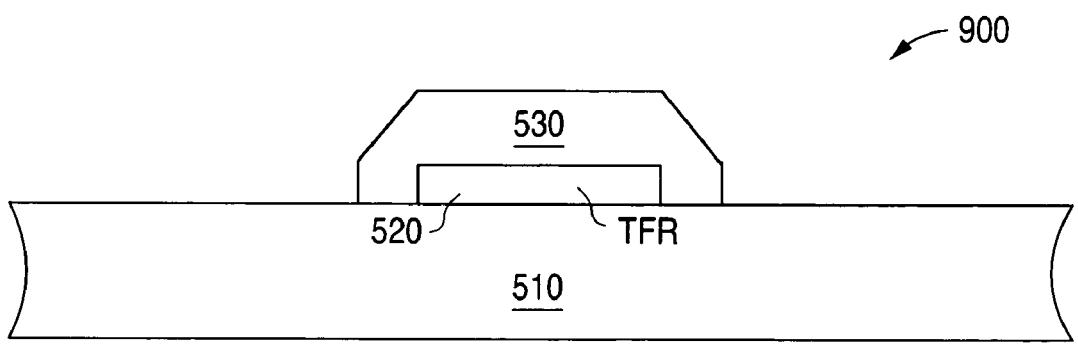

In the next step of the method of the invention the etch process continues and the etch process is applied to the integrated circuit device 800 shown in FIG. 8. The result of applying the etch process is shown in FIG. 9. The stage of the integrated circuit device shown in FIG. 9 is designated with reference numeral 900.

The etch process completely etches away the remaining portions of the conductor 710. The etch process etches away a minimal portion of the top of the resistor protect layer 530. As shown in FIG. 9, the faceted corners and reduced vertical step height of the resistor protect layer 530 means that less overetch is required. This prevents the etch process from reaching the thin film resistor (TFR) 520. In this manner, the thin film resistor (TFR) 520 is completely protected from plasma damage. The method of the invention facilitates the complete removal of the conductive filaments of the conductor 710 and the complete protection of the thin film resistor (TFR) 520 from plasma attack.

Figure 10:
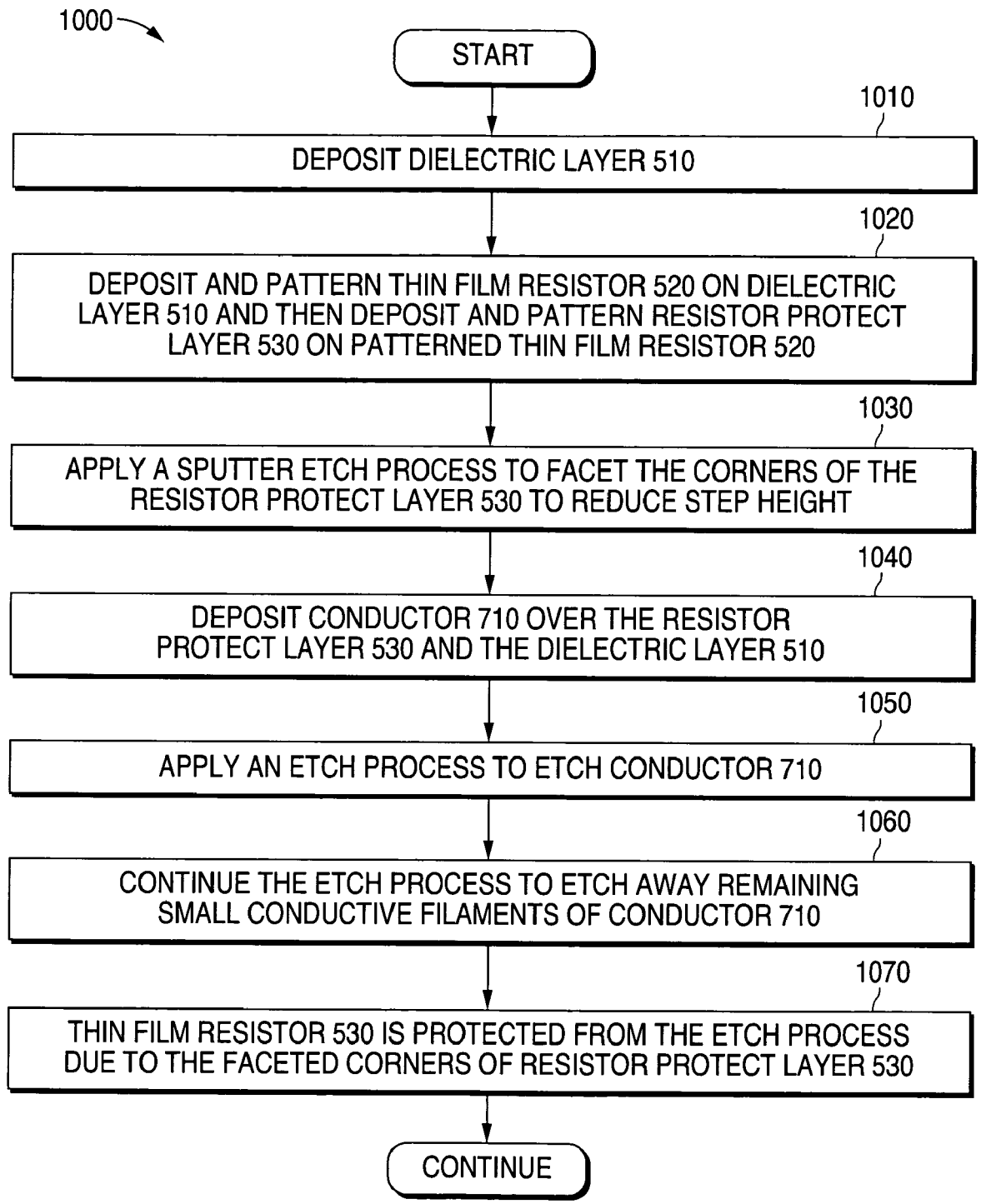
FIG. 10 illustrates a flow chart showing the steps of an advantageous embodiment of the method of the present invention.

FIG. 10 illustrates a flow chart 1000 showing the steps of an advantageous embodiment of the method of the present invention for protecting a thin film resistor. First a dielectric layer 510 is deposited (step 1010). A thin film resistor 520 is deposited on the dielectric layer 510 and patterned. A resistor protect layer 530 is deposited and patterned over the patterned thin film resistor 520 (step 1020).

A sputter etch is applied to facet the corners of the resistor protect layer 530 to reduce the step height of the resistor protect layer 530 (step 1030). Then a conductor 710 is deposited over the resistor protect layer 530 and the dielectric layer 510 (step 1040). An etch process is then applied to etch the conductor 710 (step 1050).

The etch process is continued to etch away any remaining small conductive filaments of conductor 710 (step 1060). The thin film resistor 530 is protected from the etch process due to the faceted corners of the resistor protect layer 530 (step 1070).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing a resistor protect layer to protect a thin film resistor in a semiconductor device of a type that comprises a thin film resistor mounted on a dielectric layer, said method comprising the steps of:

forming a resistor protect layer over said thin film resistor, wherein the resistor protect layer includes a first surface in contact with said dielectric layer, a second surface opposing said first surface, and first and second sides extending between said first surface and said second surface; and applying an etch process to etch away portions of a first corner between said first side and said second surface of said resistor protect layer and a second corner between said second side and said second surface of said resistor protect layer to facet said first and second corners of said resistor protect layer, wherein said resistor protect layer prevents said etch process from contacting said thin film resistor.

2. The method as set forth in claim 1 wherein said step of applying an etch process reduces a step height of said resistor protect layer.

3. The method as set forth in claim 2 wherein said step height of said resistor protect layer is reduced to approximately one fourth of an original step height of said resistor protect layer.

4. The method as set forth in claim 1 wherein said etch process has a high sputter yield between approximately forty five degrees and approximately sixty degrees.

5. The method as set forth in claim 1 wherein said etch process comprises a plasma etch with a high sputter etch component.

6. The method as set forth in claim 5 wherein said plasma etch comprises a plasma that is formed using an inert gas.

7. The method as set forth in claim 5 wherein said plasma etch comprises a plasma that is formed using a combination of an inert gas and a reactive gas.

8. The method as set forth in claim 7 wherein said inert gas comprises argon and said reactive gas comprises carbon tetrafluoride.

9. A method for using a resistor protect layer to protect a thin film resistor in a semiconductor device, said method comprising the steps of:

placing a thin film resistor on a dielectric layer of a semiconductor device;

placing a resistor protect layer over said thin film resistor, wherein the resistor protect layer includes a first surface in contact with said dielectric layer, a second surface opposing said first surface, and first and second sides extending between said first surface and said second surface; and applying an etch process to etch away portions of a first corner between said first side and said second surface of said resistor protect layer and a second corner between said second side and said second surface of said resistor protect layer to facet said first and second corners of said resistor protect layer to reduce a step height of said resistor protect layer, wherein said resistor protect layer prevents said etch process from contacting said thin film resistor.

10. The method as set forth in claim 9 further comprising the steps of:

depositing a conductor over said resistor protect layer and said dielectric layer; and applying an etch process to etch away portions of said conductor from said resistor protect layer and said dielectric layer.

11. The method as set forth in claim 10 further comprising the steps of:

applying said etch process to etch away remaining small conductive filaments of said conductor; and protecting said thin film resistor from said etch process with said resistor protect layer that comprises faceted corners.

12. The method as set forth in claim 9 wherein said step height of said resistor protect layer is reduced to approximately one fourth of an original step height of said resistor protect layer.

13. The method as set forth in claim 9 wherein said etch process has a high sputter yield between approximately forty five degrees and approximately sixty degrees.

14. The method as set forth in claim 9 wherein said etch process comprises a plasma etch with a high sputter etch component.

15. The method as set forth in claim 14 wherein said plasma etch comprises a plasma that is formed using an inert gas.

16. The method as set forth in claim 14 wherein said plasma etch comprises a plasma that is formed using a combination of an inert gas and a reactive gas.

17. The method as set forth in claim 16 wherein said inert gas comprises argon and said reactive gas comprises carbon tetrafluoride.

\* \* \* \* \*